United States Patent
Cha

(10) Patent No.: US 8,460,993 B2
(45) Date of Patent: *Jun. 11, 2013

(54) METHOD FOR FABRICATING CMOS IMAGE SENSOR WITH PLASMA DAMAGE-FREE PHOTODIODE

(75) Inventor: Han-Seob Cha, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 835 days.

This patent is subject to a terminal disclaimer.

(21) Appl. No.: 12/619,465

(22) Filed: Nov. 16, 2009

(65) Prior Publication Data

US 2010/0062576 A1    Mar. 11, 2010

Related U.S. Application Data

(63) Continuation of application No. 11/727,750, filed on Mar. 28, 2007, now Pat. No. 7,629,216.

(30) Foreign Application Priority Data

Apr. 28, 2006 (KR) .................... 10-2006-0038787

(51) Int. Cl.
*H01L 21/8238* (2006.01)

(52) U.S. Cl.
USPC .................. 438/231; 257/292; 257/E27.133; 257/E27.132

(58) Field of Classification Search
USPC ................. 438/229–231, 299; 257/291–293, 257/443, 444, 446, E27.133, E27.132
See application file for complete search history.

(56) References Cited

U.S. PATENT DOCUMENTS

| 6,570,222 B2* | 5/2003 | Nozaki et al. | 257/347 |
| 6,900,507 B1* | 5/2005 | Hong | 257/413 |
| 6,974,715 B2* | 12/2005 | Lee | 438/48 |
| 7,005,689 B2* | 2/2006 | Song et al. | 257/290 |
| 7,381,584 B2 | 6/2008 | Lim | |
| 2005/0059177 A1 | 3/2005 | Rhodes | |
| 2007/0007611 A1 | 1/2007 | Park | |
| 2007/0020796 A1 | 1/2007 | Park | |
| 2007/0166865 A1* | 7/2007 | Lee | 438/57 |

FOREIGN PATENT DOCUMENTS

| JP | 200012822 | 1/2000 |
| JP | 20050072236 | 3/2005 |
| JP | 2005302836 | 10/2005 |
| KR | 20020017747 | 3/2002 |
| KR | 20040058708 | 7/2004 |
| KR | 20040058733 | 7/2004 |
| KR | 20060077115 | 7/2006 |

* cited by examiner

*Primary Examiner* — David Vu

(74) *Attorney, Agent, or Firm* — McAndrews, Held & Malloy, Ltd.

(57) ABSTRACT

A method for fabricating a complementary metal-oxide semiconductor (CMOS) image sensor includes providing a semifinished substrate, forming a patterned blocking layer over a photodiode region of the substrate, implanting impurities on regions other than the photodiode region using a mask while the patterned blocking layer remains, and removing the mask.

23 Claims, 7 Drawing Sheets

METHOD FOR FABRICATING CMOS IMAGE SENSOR WITH PLASMA DAMAGE-FREE PHOTODIODE

CROSS-REFERENCE TO RELATED APPLICATIONS

This application is a continuation of U.S. application Ser. No. 11/727,750, entitled "Method for Fabricating CMOS Image Sensor With Plasma Damage-Free Photodiode," filed Mar. 28, 2007, now U.S. Pat. No. 7,629,216, which claims priority of Korean patent application number 10-2006-0038787, filed on Apr. 28, 2006, both of which are hereby incorporated by reference in their entireties.

BACKGROUND OF THE INVENTION

The present invention relates to a method for fabricating an image sensor, and more particularly, to a method for fabricating a complementary metal-oxide semiconductor (CMOS) image sensor.

A typical image sensor is a device for capturing image information using the photo-reaction property of a semiconductive material. The typical image sensor changes different electrical values generated in each pixel into certain levels allowing signal treatments, wherein the pixel senses subjects with different light intensity and wavelengths.

Such image sensors include charge coupled device (CCD) image sensors and CMOS image sensors. The image sensors use a photodiode as a light receiving device. The photodiode absorbs the light imaging an external image, and collects and stores photocharges.

FIG. 1 illustrates a cross-sectional view showing a photodiode of a typical CMOS image sensor. A deep N⁻ type region 15 is formed in a photodiode region of a substrate 11. The substrate 11 includes a P-type (P⁺⁺) substrate 11A highly doped with P-type impurities, and a P-type epitaxial layer 11B which is formed over the P-type substrate 11A by lowly doping P-type impurities in-situ and performing an epitaxial growth process. A P⁰ region 16 is formed over the deep N⁻ type region 15. A gate oxide layer 13 and a gate electrode 14 of a transfer transistor (TX) are formed over the substrate 11, next to the photodiode region. Although reference numerals are omitted, lightly doped drain (LDD) spacers are formed over sidewalls of the gate electrode 14. Reference numeral 12 represents an isolation structure.

When light impinges upon the substrate structure, electron-hole pairs are generated by the light near a PN junction region including the deep N⁻ type region 15 and the P-type epitaxial layer 11B. These carriers move to the transfer transistor (TX) by a supplied bias, generating current. Thus, light energy is converted into current.

The PN junction region including the deep N⁻ type region 15 and the P-type epitaxial layer 11B formed below becomes a photodiode. An uppermost portion of the photodiode is doped with P-type impurities, i.e., the P⁰ region 16, isolating the photodiode region and a silicon surface. Thus, an inflow of dark current caused by a silicon dangling bond of the silicon surface may be reduced. The P⁰ region 16 is formed using an ion implantation process.

However, damages, which are generated during various plasma processes usually needed in fabricating a wafer, may exist over an upper portion of the photodiode. Such damages may generate dark current. Also, some of the heavy metals composing photoresist may not be removed during a subsequent photoresist layer removal process, and may remain over a surface of the photodiode. In such a case, the heavy metals may diffuse inwardly during a subsequent thermal process and cause the dark current generation. However, it may be difficult to substantially remove the heavy metal contamination caused by the plasma damages or the photoresist layer removal process when fabricating a semiconductor device.

SUMMARY OF THE INVENTION

Embodiments of the present invention are directed toward providing a method for fabricating a photodiode of a complementary metal-oxide semiconductor (CMOS) image sensor, which can reduce heavy metal contamination caused by plasma damages or photoresist layer process generating dark current.

In accordance with an aspect of the present invention, there is provided a method for fabricating a CMOS image sensor, including: providing a semi-finished substrate; forming a patterned blocking layer over a photodiode region of the substrate; implanting impurities on regions other than the photodiode region using a mask while the patterned blocking layer remains; and removing the mask.

In accordance with another aspect of the present invention, there is provided a method for fabricating a CMOS image sensor, including: forming a gate structure over a transistor region of a substrate structure; implanting impurities onto the substrate structure on one side of the gate structure to form a photodiode; forming a patterned blocking layer over the photodiode; implanting impurities on the transistor region using a mask while the patterned blocking layer remains; and removing the mask.

In accordance with a further another aspect of the present invention, there is provided a method for fabricating a CMOS image sensor, including: forming a gate structure over a transistor region of a substrate structure; performing a first ion implantation process on the substrate structure on one side of the gate structure to form a photodiode using a first mask; forming a patterned blocking layer over the photodiode; performing a second ion implantation process on the transistor region using a second mask while the patterned blocking layer remains; forming spacers on sidewalls of the gate structure; and performing a third ion implantation process using the spacers and a mask pattern as a third mask.

DESCRIPTION OF SPECIFIC EMBODIMENTS

The present invention relates to a method for fabricating a complementary metal-oxide semiconductor (CMOS) image sensor with a plasma damage-free photodiode. Dark current may be substantially removed using blocking layers. The blocking layers block a photodiode from plasma damages and contamination of heavy metals of photoresist, generally occurring before and after forming the photodiode.

FIGS. 2A to 2L illustrate cross-sectional views of a method for fabricating a CMOS image sensor according to an embodiment of the present invention.

Figure 1:
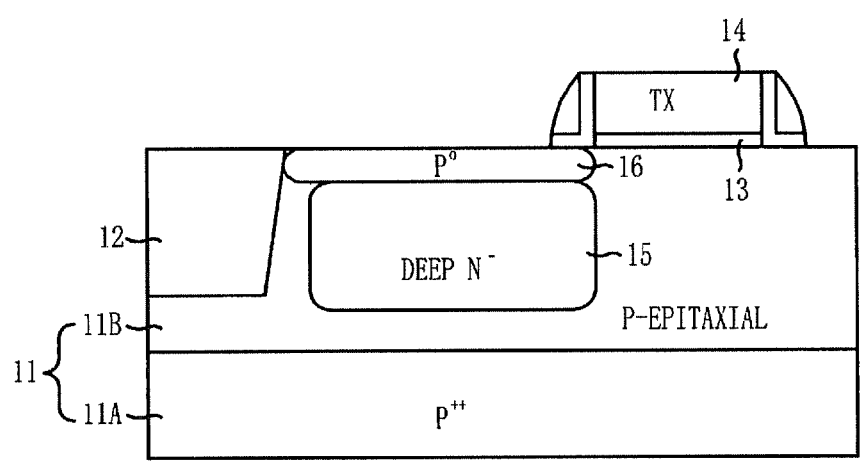
FIG. 1 illustrates a cross-sectional view showing a structure of a typical CMOS image sensor.
Figure 2A:
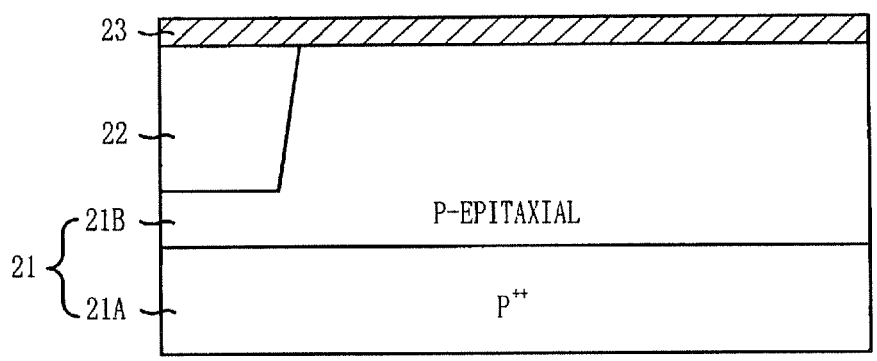
FIGS. 2A to 2L illustrate cross-sectional views of a method for fabricating a CMOS image sensor according to an embodiment of the present invention.

Referring to FIG. 2A, a substrate 21 includes a P-type (P⁺⁺) substrate 21A highly doped with P-type impurities, and a P-type epitaxial layer 21B which is formed over the P-type substrate 21A by lowly doping P-type impurities in-situ and performing an epitaxial growth process. An isolation structure 22 is formed in the substrate 21 using a typical method. For instance, the isolation structure 22 may be formed using a shallow trench isolation (STI) method.

A first blocking oxide layer 23 is formed over the substrate 21 using a chemical vapor deposition (CVD) method or a thermal oxidation method. For instance, the first blocking oxide layer 23 may include tetraethyl orthosilicate (TEOS) using a CVD method. The first blocking oxide layer 23 may be formed to a thickness ranging from approximately 20 Å to approximately 2,000 Å.

Figure 2B:
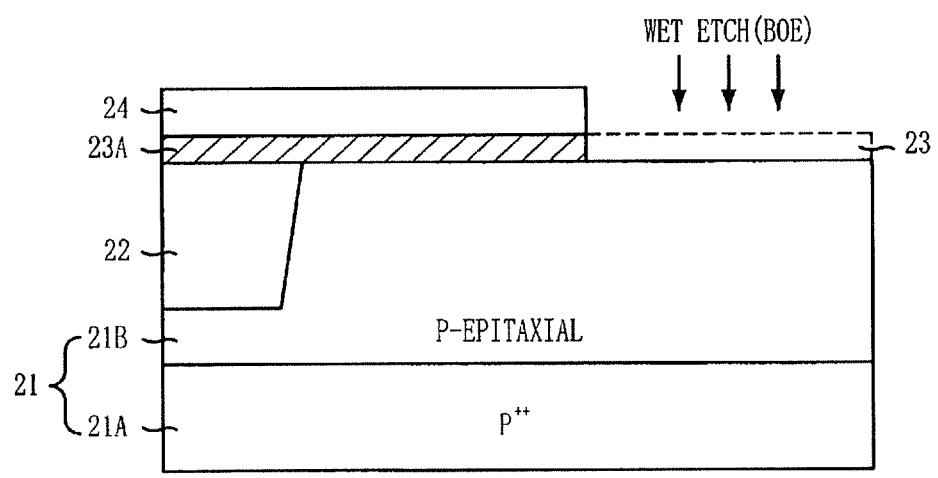

Referring to FIG. 2B, a photoresist layer is formed over the first blocking oxide layer 23, and a photo-exposure and developing process is performed to form a first blocking mask 24. The first blocking oxide layer 23 is then etched using the first blocking mask 24 as an etch barrier. At this time, the first blocking oxide layer 23 is etched using a wet etch process instead of using a dry etch process utilizing plasmas. Thus, plasma damages may be reduced, which may occur on an exposed surface of the substrate 21 during the etching of the first blocking oxide layer 23. In particular, the wet etch process of the first blocking oxide layer 23 may use a buffered oxide etchant (BOE) or a hydrogen fluoride (HF) solution. A portion of the first blocking oxide layer 23 formed over a region which excludes a photodiode region, e.g., a transistor region, is removed. That is, a patterned first blocking oxide layer 23A remains over the photodiode region.

Figure 2C:
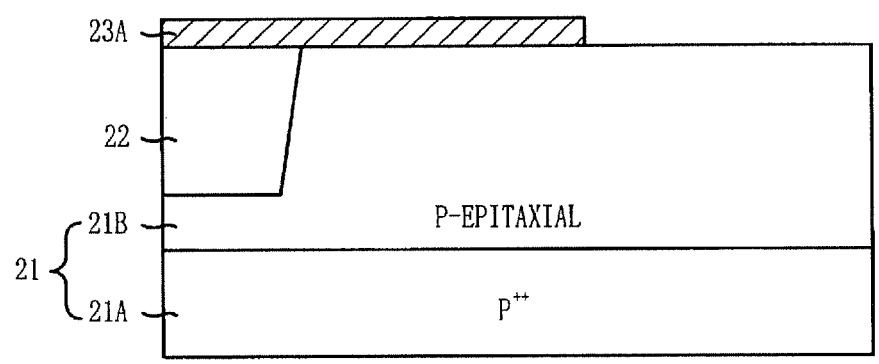

Referring to FIG. 2C, the first blocking mask 24 is removed. At this time, the first blocking mask 24 is removed using a removal process utilizing plasmas since the first blocking mask 24 includes photoresist. Meanwhile, plasma damages may occur on the exposed surface of the substrate 21 because plasmas are used during the removal process. However, it may be allowed to use plasmas because the exposed surface of the substrate 21 is not the photodiode region. After removing the first blocking mask 24, the patterned first blocking oxide layer 23A remains over the photodiode region of the substrate 21. Hereinafter, the patterned first blocking oxide layer 23A is referred to as the first blocking layer 23A.

Figure 2D:
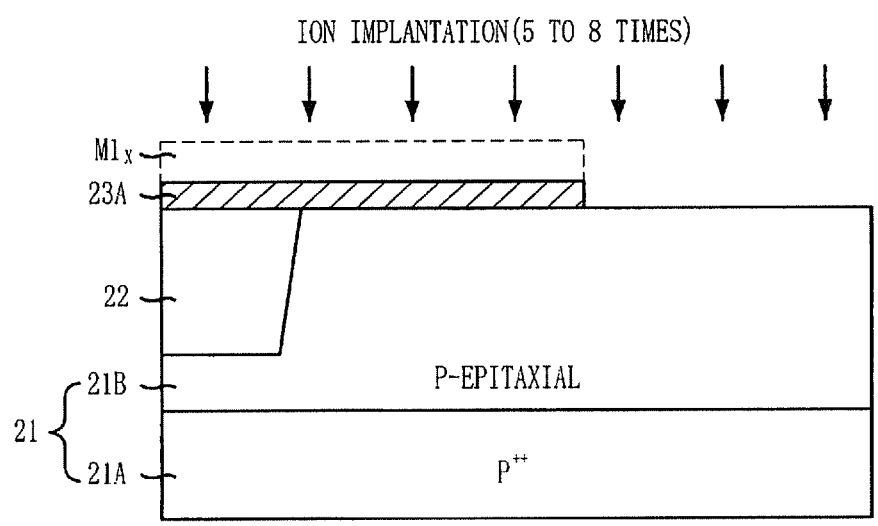

Referring to FIG. 2D, the photodiode region is blocked with the first blocking layer 23A, and a subsequent ion implantation process is performed. The subsequent ion implantation process refers to ion implantation processes performed after the forming of the isolation structure 22 until a gate oxide layer is formed. There are approximately 5 to 8 kinds of such ion implantation processes using photoresist masks. Accordingly, although not illustrated, a photoresist removal process may be performed for a number of times as represented with a reference denotation $M1_X$, where X represents the number of photoresist masks formed and removed. At this time, plasma damages generated during the photoresist removal processes may damage the photodiode region because the photoresist removal process usually uses a plasma process. However, the plasma damages may be blocked if the photodiode region is blocked with the first blocking layer 23A including oxide according to this embodiment of the present invention.

Photoresist contains a small amount of heavy metals. However, penetration of the heavy metals may be reduced because the photodiode region may not directly contact the photoresist when fabricated according to this embodiment of the present invention. Accordingly, the photodiode region may be protected from the plasma damages by forming the first blocking layer 23A to a thickness ranging from approximately 20 Å to approximately 2,000 Å.

Figure 2E:
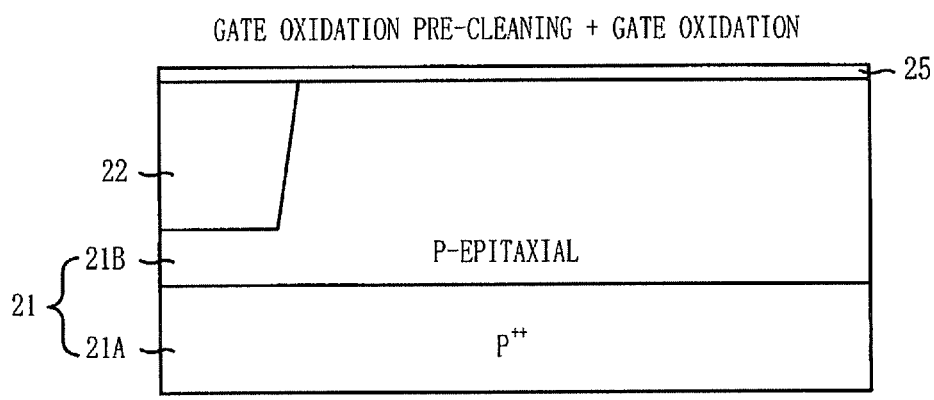

Referring to FIG. 2E, a gate oxide layer 25 is formed over the substrate 21 through gate oxidation after the aforementioned various ion implantation processes are performed. At this time, it is generally essential to perform a gate oxidation pre-cleaning process before forming the gate oxide layer 25. The first blocking layer 23A is removed during the gate oxidation pre-cleaning process. For instance, the gate oxidation pre-cleaning process may use a BOE or a HF solution. The first blocking layer 23A including oxide may be easily removed by the BOE or the HF solution. Also, plasma damages may not occur on a surface of the substrate 21 because the gate oxidation pre-cleaning process includes performing a wet process.

Figure 2F:
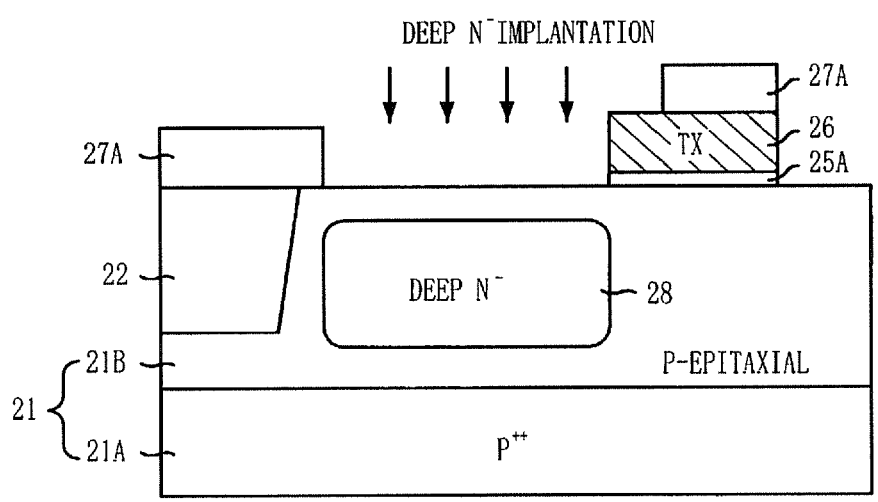
Figure 2G:
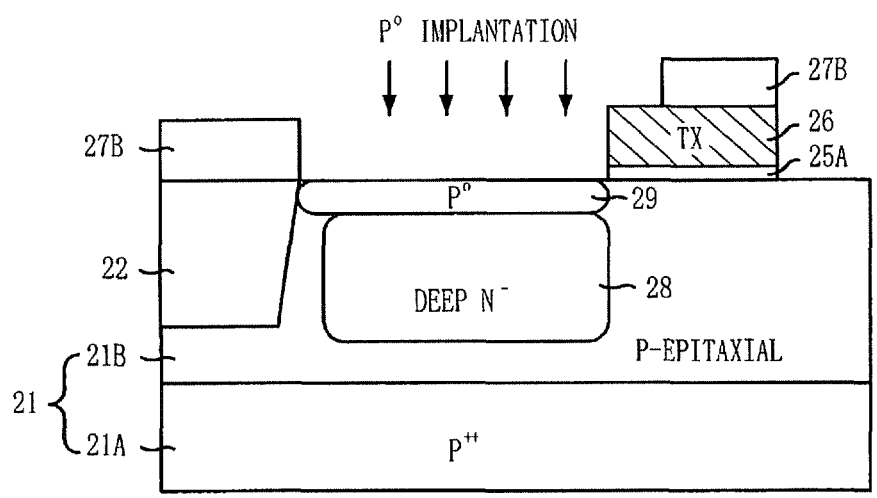

Referring to FIGS. 2F and 2G, a polysilicon layer for use as a gate electrode 26 is formed over the gate oxide layer 25, and a gate patterning process is performed to form the gate electrode 26. In the drawings, only a gate electrode TX of a transfer transistor is illustrated. Reference numeral 25A represents a patterned gate oxide layer 25A.

Ion implantation processes are performed on the photodiode region to foam a deep $N^-$ type region 28 and a $P^0$ region 29. In more detail, a photoresist layer is formed over the gate electrode 26. A photo-exposure and developing process is performed on the photoresist layer to form first ion implantation masks 27A (FIG. 2F). At this time, the photodiode region is exposed by the first ion implantation masks 27A. One side of the first ion implantation masks 27A may be aligned near the center of the gate electrode 26, and another side of the first ion implantation masks 27A may be aligned in manner that the side partially extends from an edge of the isolation structure 22 toward the photodiode region. N-type impurity ions are implanted, that is, a deep N-implantation process is performed, using a typical ion implantation method to form the deep $N^-$ type region 28.

Referring to FIG. 2G, the first ion implantation masks 27A are removed and the $P^0$ region 29 is formed. In more detail, a photoresist layer is formed and a photo-exposure and developing process is performed to form second ion implantation masks 27B. P-type impurity ions, e.g., boron (B), are then implanted, that is, a first $P^0$ ion implantation process is performed. A photodiode is formed by forming the deep $N^-$ type region 28 and the $P^0$ region 29 through the aforementioned series of impurity ion implantation processes.

Generally, a PN junction region including the deep N" type region 28 and the $P^0$ region 29 below the deep $N^-$ type region 28 becomes the photodiode. The photodiode includes the $P^0$ region 29 at an uppermost portion, and the $P^0$ region 29 isolates the photodiode region and a silicon surface, reducing an inflow of dark current caused by a silicon dangling bond on the silicon surface.

Figure 2H:
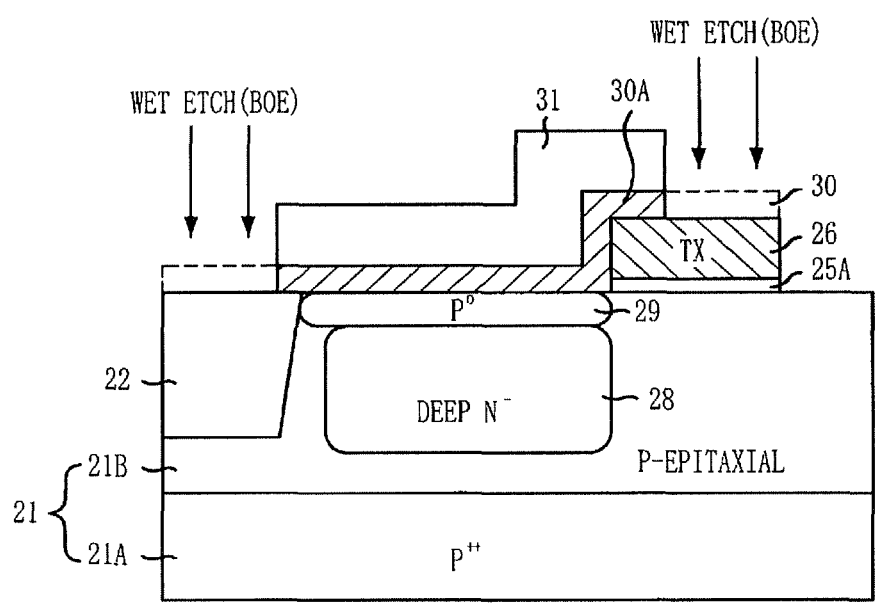

Referring to FIG. 2H, the second ion implantation masks 27B are removed. At this time, the second ion implantation masks 27B are removed using plasmas. A second blocking oxide layer 30 is formed over the substrate structure. The second blocking oxide layer 30 is formed to a thickness ranging from approximately 20 Å to 2,000 Å using a CVD method or a thermal oxidation method. For instance, the second blocking oxide layer 30 may include TEOS using a CVD method. The second blocking oxide layer 30 functions as a blocking layer for reducing plasma damages.

A photoresist layer is formed over the second blocking oxide layer 30. A photo-exposure and developing process is performed to form a second blocking mask 31. The second blocking oxide layer 30 is etched using the second blocking mask 31 as an etch barrier. At this time, the second blocking oxide layer 30 is etched using a wet etch process instead of a dry etch process using plasmas. Thus, plasma damages may be reduced, which may occur on exposed surfaces of the substrate 21 during the etching of the second blocking oxide layer 30. In particular, the wet etch process of the second blocking oxide layer 30 may use a BOE or a HF solution. Portions of the second blocking oxide layer 30 formed over regions which exclude the photodiode region are removed. That is, a patterned second blocking oxide layer 30A remains over the photodiode region.

Figure 2I:
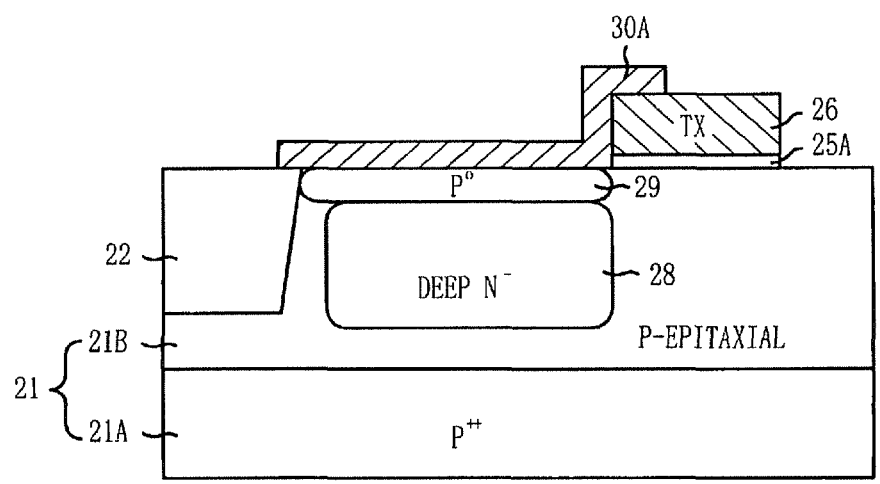

Referring to FIG. 2I, the second blocking mask 31 is removed. At this time, the second blocking mask 31 is removed using a removal process utilizing plasmas since the second blocking mask 31 includes photoresist. Meanwhile, plasma damages may occur on the exposed surfaces of the substrate 21 because plasmas are used during the removal process. However, it may be allowed to use plasmas because the exposed surfaces of the substrate 21 are not the photodiode region.

After removing the second blocking mask 31, the patterned second blocking oxide layer 30A remains over the photodiode region of the substrate 21. Hereinafter, the patterned second blocking oxide layer 30A is referred to as the second blocking layer 30A.

Figure 2J:
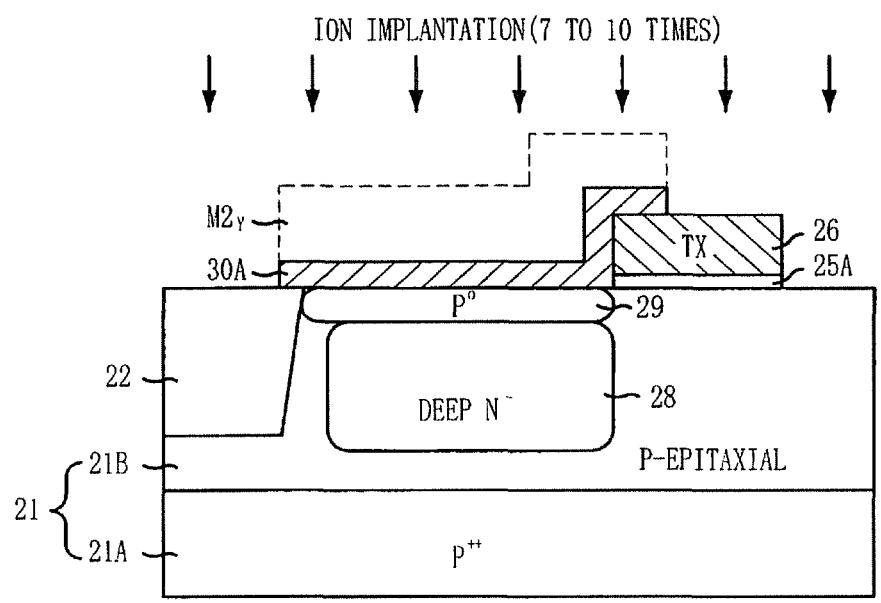

Referring to FIG. 2J, the photodiode region is blocked with the second blocking layer 30A, and a subsequent ion implantation process is performed. The subsequent ion implantation process refers to performing an ion implantation process, e.g., lightly doped drain (LDD) ion implantation, for approximately 7 to 10 times on the transistor region using a photoresist layer as a mask after gate patterning. Accordingly, although not illustrated, the photoresist removal process may be performed for a number of times as represented with a reference denotation $M2_Y$, where Y represents the number of photoresist masks formed and removed. At this time, plasma damages generated during the photoresist removal process may damage the photodiode region because the photoresist removal process usually uses a plasma process. However, the plasma damages may be blocked if the photodiode region is blocked with the second blocking layer 30A including oxide in accordance with this embodiment of the present invention.

Photoresist contains a small amount of heavy metals. However, penetration of the heavy metals may be reduced because the photodiode region may not directly contact the photoresist when fabricated according to this embodiment of the present invention.

Figure 2K:
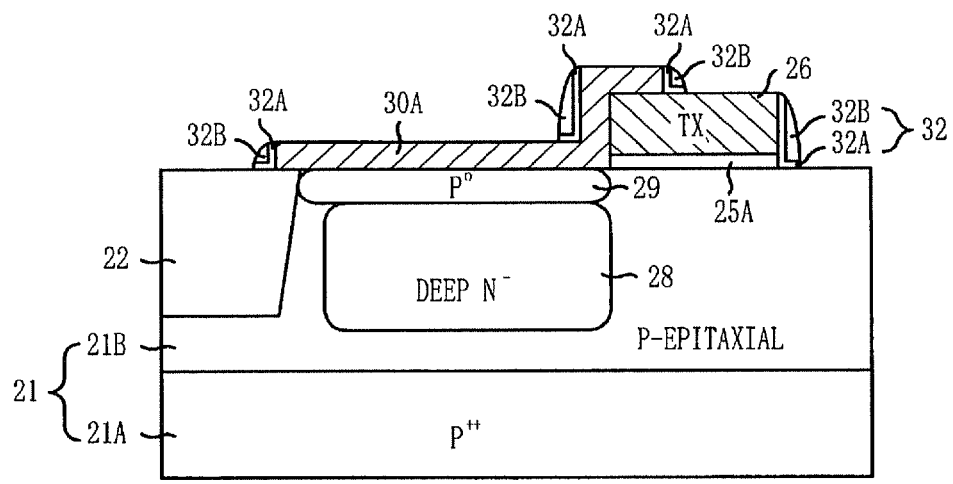

Referring to FIG. 2K, a typical process for forming LDD spacers 32 is performed while the second blocking layer 30A remains. That is, a spacer insulation layer is formed over the second blocking layer 30A, and a spacer etch process is then performed to form the LDD spacers 32. At this time, the LDD spacers 32 are formed on sidewalls of the gate electrode 26, and have a double structure including a TEOS layer 32A and a nitride-based layer 32B. Meanwhile, the double structure including the TEOS layer 32A and the nitride-based layer 32B may be formed on sidewalls of both ends of the second blocking layer 30A, and on sidewalls of a portion of the second blocking layer 30A formed over one side of the gate electrode 26.

The spacer etch process generally includes performing a dry etch process using plasmas. Even if a large amount of plasma damages occurs on the photodiode during the spacer etch process, the second blocking layer 30A may substantially block the plasma damages.

A typical source/drain ion implantation process using the LDD spacers 32 and a photoresist layer as a mask is performed. Meanwhile, a method shown in FIG. 2L may be used when performing a second $P^0$ ion implantation process after forming the LDD spacers 32, in addition to the first $P^0$ ion implantation process performed earlier for forming the $P^0$ region 29.

Figure 2L:
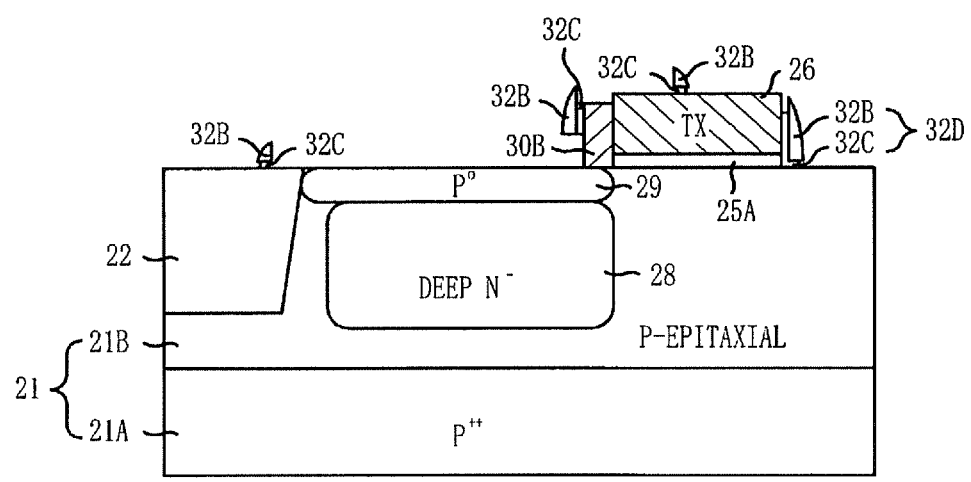

Referring to FIG. 2L, the second blocking layer 30A is removed using a wet etch process after performing the typical source/drain ion implantation process in order to perform the second $P^0$ ion implantation process. The wet etch process uses a BOE or HF solution. At this time, portions of the TEOS layers 32A in the LDD spacers 32, the TEOS layers 32A including an oxide-based material substantially the same as the second blocking layer 30A, may be etched away. Reference numerals 32C and 32D represent remaining TEOS layers 32C and remaining LDD spacers 32D, respectively. The second blocking layer 30A is removed until a top surface of the photodiode is substantially exposed at least, and a remaining second blocking layer 30B may remain on one side of the gate electrode 26 over an edge of the photodiode.

The second blocking layer 30A is removed because the second blocking layer 30A has a large thickness. The subsequent second $P^0$ ion implantation process may be easily performed by removing the second blocking layer 30A beforehand. The second $P^0$ ion implantation process is performed. At this time, a buffer oxide layer may be formed to a small thickness ranging from approximately 50 Å to 200 Å to reduce ion implantation damages occurring on the surface of the substrate 21 during the second $P^0$ ion implantation process.

In accordance with the embodiment of the present invention, the plasma damages and heavy metal contamination generally occurring during the ion implantation processes and the photoresist removal processes, which are performed before and after forming the photodiode, may be substantially reduced using the first and second blocking layers. Furthermore, the blocking layers may reduce plasma damages occurring during the subsequent dry etch process using plasmas.

While the present invention has been described with respect to the specific embodiments, it will be apparent to those skilled in the art that various changes and modifications may be made without departing from the spirit and scope of the invention as defined in the following claims.

The invention claim is:

1. A method for fabricating a complementary metal-oxide semiconductor (CMOS) image sensor, the method comprising:
    forming a gate structure on a substrate;
    performing a first ion-implantation process on the substrate proximate the gate structure to form a photodiode using a first mask;
    forming a first patterned blocking layer over the photodiode;
    forming spacers on sidewalls of the gate structure and on sidewalls of the first patterned blocking layer;
    performing a second ion-implantation process using the spacers and a mask pattern as a second mask; and
    after said performing a second ion-implantation process:
        removing the first patterned blocking layer to expose an upper portion of the photodiode;
        forming a buffer layer over the exposed upper portion of the photodiode; and
        performing a third ion-implantation process on the exposed photodiode.

2. The method of claim 1, wherein the first mask and the mask pattern each comprises a photoresist-based material.

3. The method of claim 1, wherein said forming a first patterned blocking layer over the photodiode comprises:
    forming a blocking layer over the substrate;
    forming a blocking mask over the blocking layer to cover the photodiode; and etching the blocking layer using the blocking mask to form the patterned blocking layer remaining over the photodiode.

4. The method of claim 3, wherein said etching the blocking layer comprises performing a wet etch process.

5. The method of claim 4, wherein said performing a wet etch process comprises using one of a buffered oxide etchant (BOE) or a hydrogen fluoride (HF) solution.

6. The method of claim 1, wherein the first patterned blocking layer comprises an oxide-based layer.

7. The method of claim 6, wherein the oxide-based layer is formed using one of a chemical vapor deposition (CVD) method or a thermal oxidation method.

8. The method of claim 6, wherein the first patterned blocking layer is formed to a thickness ranging from 20 Å to 2,000 Å.

9. The method of claim 1, further comprising:
forming a second patterned blocking layer;
implanting impurities on regions other than the photodiode region using a third mask while the second pattern blocking layer remains; and
removing the third mask.

10. The method of claim 9, wherein the third mask comprises a photoresist-based material.

11. A method for fabricating a complementary metal-oxide semiconductor (CMOS) image sensor, the method comprising:
forming spacers on sidewalls of a gate structure and on sidewalls of a patterned blocking layer;
performing an ion-implantation process using the spacers and a mask pattern; and
after performing an ion implantation process:
removing the patterned blocking layer to expose an upper portion of a photodiode;
forming a buffer layer over an exposed upper portion of the photodiode; and
performing an additional ion-implantation process on the exposed photodiode.

12. The method of claim 11, further comprising forming the gate structure on a substrate.

13. The method of claim 11, further comprising performing an initial ion-implantation process on a substrate proximate a gate structure to form a photodiode using a first mask.

14. The method of claim 11, further comprising forming the patterned blocking layer over a photodiode.

15. The method of claim 14, wherein said forming the patterned blocking layer over a photodiode comprises:
forming a blocking layer over a substrate;
forming a blocking mask over the blocking layer to cover the photodiode; and
etching the blocking layer using the blocking mask to form the patterned blocking layer remaining over the photodiode.

16. The method of claim 15, wherein said etching the blocking layer comprises performing a wet etch process.

17. The method of claim 16, wherein said performing a wet etch process comprises using one of a buffered oxide etchant (BOE) or a hydrogen fluoride (HF) solution.

18. The method of claim 11, wherein the mask pattern comprises a photoresist-based material.

19. The method of claim 11, wherein the patterned blocking layer comprises an oxide-based layer.

20. The method of claim 19, wherein the oxide-based layer is formed using one of a chemical vapor deposition (CVD) method or a thermal oxidation method.

21. The method of claim 19, wherein the patterned blocking layer is formed to a thickness ranging from 20 Å to 2,000 Å.

22. The method of claim 11, further comprising:
forming an additional patterned blocking layer;
implanting impurities on regions other than a photodiode region using an additional mask while the additional pattern blocking layer remains; and
removing the additional mask.

23. The method of claim 22, wherein the additional mask comprises a photoresist-based material.

* * * * *

UNITED STATES PATENT AND TRADEMARK OFFICE
CERTIFICATE OF CORRECTION

PATENT NO. : 8,460,993 B2  
APPLICATION NO. : 12/619465  
DATED : June 11, 2013  
INVENTOR(S) : Cha Page 1 of 1

It is certified that error appears in the above-identified patent and that said Letters Patent is hereby corrected as shown below:

In the Specification:

In Column 2, Line 52, delete "DESCRIPTION" and insert -- DETAILED DESCRIPTION --, therefor.

In Column 4, Line 19, delete "foam" and insert -- form --, therefor.

In Column 4, Line 42, delete "N" type" and insert -- N⁻ --, therefor.

Signed and Sealed this  
First Day of April, 2014

Michelle K. Lee  
*Deputy Director of the United States Patent and Trademark Office*